United States Patent
Keshavarzi et al.

(10) Patent No.: US 6,794,630 B2
(45) Date of Patent: Sep. 21, 2004

(54) METHOD AND APPARATUS FOR ADJUSTING THE THRESHOLD OF A CMOS RADIATION-MEASURING CIRCUIT

(75) Inventors: Ali Keshavarzi, Portland, OR (US); Jaume A. Segura, Palma de Mallorca (ES); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 10/024,467

(22) Filed: Dec. 17, 2001

(65) Prior Publication Data

US 2003/0111591 A1 Jun. 19, 2003

(51) Int. Cl.[7] .............................................. H01L 31/00
(52) U.S. Cl. ................................ 250/214.1; 250/370.07
(58) Field of Search ........................ 250/214 SW, 214.1, 250/370.07, 370.14, 370.01, 214 R, 214 SG; 378/97, 108; 327/307, 534; 257/290, 291, 292; 348/308

(56) References Cited

U.S. PATENT DOCUMENTS

| | | | | | |
|---|---|---|---|---|---|
| 5,105,078 | A | * | 4/1992 | Nochise et al. | 250/223 R |
| 5,694,448 | A | * | 12/1997 | Morcom | 378/98.8 |
| 6,141,243 | A | * | 10/2000 | Aslam et al. | 365/185.01 |
| 6,388,494 | B1 | * | 5/2002 | Kindt et al. | 327/307 |
| 6,404,269 | B1 | * | 6/2002 | Voldman | 327/534 |
| 2001/0019285 | A1 | * | 9/2001 | Lin et al. | 327/534 |

* cited by examiner

Primary Examiner—Thanh X. Luu
(74) Attorney, Agent, or Firm—Fish & Richardson P.C.

(57) ABSTRACT

A radiation measuring technique includes adjusting a threshold level of a radiation sensor in a radiation-measuring circuit and obtaining an output signal based on radiation dose sensed by the radiation sensor.

7 Claims, 1 Drawing Sheet

METHOD AND APPARATUS FOR ADJUSTING THE THRESHOLD OF A CMOS RADIATION-MEASURING CIRCUIT

BACKGROUND

This invention relates to a CMOS radiation-measuring circuit with a variable threshold.

A complementary-symmetry MOSFET (CMOS) radiation-measuring circuit may include transistors configured to provide a digital output that changes from one state to another when the radiation dose absorbed by the circuit exceeds a threshold. The size of the devices used in the CMOS radiation-measuring circuit determines the radiation dosage that will cause the digital output of the CMOS radiation-measuring circuit to change from one digital state to another digital state. Hence, the design of a CMOS radiation-measuring circuit requires careful consideration of the size of transistors in the circuit.

When the voltage applied between the gate and source terminals of a MOSFET exceeds a certain voltage, the MOSFET turns on. This voltage is referred to as the threshold voltage. The threshold voltages of p-channel type MOSFET (PMOS) and n-channel type MOSFET (nMOS) devices are sensitive to ionizing radiation. Generally, the threshold voltage of an irradiated MOSFET device shifts due to an increase of trapped charge in the oxide and interface states.

DETAILED DESCRIPTION

Figure 1:
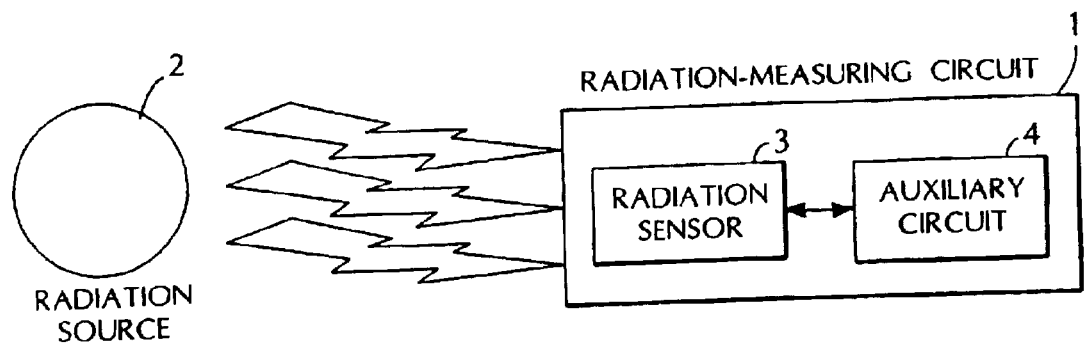
FIG. 1 illustrates a system that includes a radiation sensor.

As shown in FIG. 1, a CMOS radiation-measuring circuit 1 with a variable threshold may be exposed to a source of radiation 2 to determine when a threshold radiation dose has been reached. The radiation-measuring circuit 1 includes a radiation sensor 3 and an auxiliary circuit 4. The radiation-measuring circuit 1 may be used, for example, as a built-in radiation-measuring circuit in standard circuits to prevent malfunction due to radiation hazards. The CMOS radiation-measuring circuit with a variable threshold may have a wide range of applications in spacecraft design, medicine, nuclear plant and personal dosimetry. The radiation-measuring circuit may be used as or incorporated in a dosimeter. Depending on its specific application, dose ranges from millirads to tens of megarads may be detected by the circuit.

Figure 2:
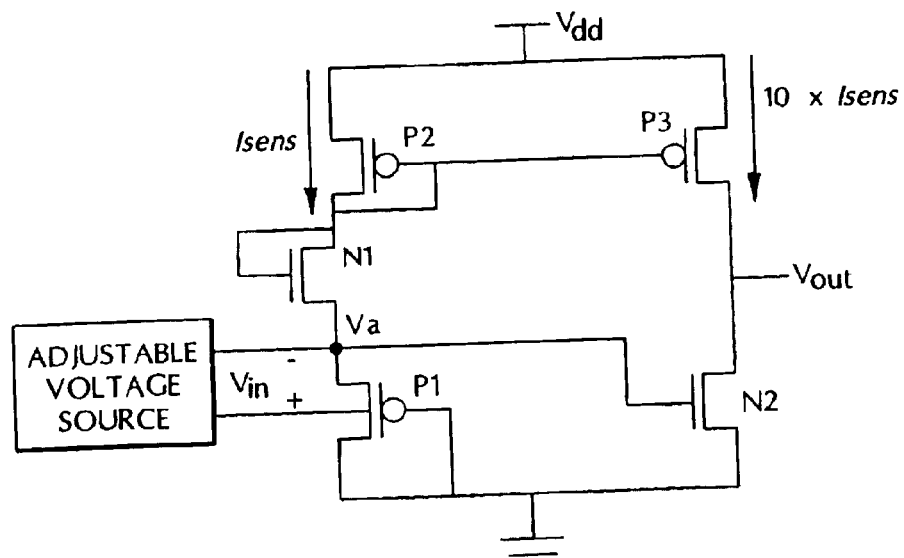
FIG. 2 is a schematic of a radiation sensor with a variable threshold.

FIG. 2 illustrates details of a CMOS radiation-measuring circuit that may be used to measure a variable radiation dose. A pMOS transistor P1 serves as the radiation sensor 3. This transistor is coupled to the auxiliary circuit 4 that includes a current mirror with pMOS transistors P2 and P3. The pMOS current mirror generates a current that is a multiple of the reference current source ($I_{sens}$). For example, in one implementation, the current through the second side of the current mirror (transistor P3) is ten times the reference current ($I_{sens}$) through the first side of the current mirror (transistor P2). The source terminal of the radiation-sensing transistor P1 is coupled to a first side of the current mirror (transistor P2) through a resistive element N1. Thus, the radiation-sensing transistor P1 is biased through the resistive element N1 and the transistor P2.

The resistive element N1 causes the voltage at the drain terminal of the transistor P2 to differ from the voltage ($V_a$) at the source terminal of the radiation-sensing transistor P1. The resistance of the element N1 should not be affected by radiation. In some implementations, the resistive element N1 may include a resistor. However, the use of a transistor as the resistive element N1 can provide better efficiency and better control because it uses less silicon area. In one embodiment, the resistive element N1 includes an nMOS transistor with its gate terminal shorted to its drain terminal. The transistor P2 that forms the first side of the current mirror may have its gate terminal shorted to its drain terminal. The source terminal of the sensing transistor P1 also is coupled to an output load nMOS transistor N2 that is coupled to the second side of the current mirror (transistor P3).

The width (W) and length (L) of a channel region of a pMOS transistor affects its behavior. The current through the left-hand side of the circuit ($I_{sens}$) may be approximated by:

$$I_{sens} = \mu p C_{ox}(W/L)(V_a - |V_{tp1}|)^2$$

where up is the hole mobility, $C_{ox}$ is the gate oxide capacitance, and $V_{tP1}$ is the threshold voltage of transistor P1. The dimensions of the devices used in the radiation-measuring circuit can be selected so that when the circuit is not exposed to radiation and the input voltage ($V_{in}$) across the body terminal and the source terminal of the radiation-sensing transistor P1 is zero, the gate-source voltage of the radiation-sensing transistor P1 is slightly beyond its non-irradiated threshold voltage value. Therefore, even when the radiation-measuring circuit is not exposed to radiation, the radiation-sensing transistor P1 is enabled.

Additionally, when the circuit is not exposed to radiation, the current $I_{sens}$ is magnified by the current mirror (transistors P2 and P3). The circuit is designed so that the voltage ($V_a$) is above the threshold voltage of transistor P1 ($V_{tP1}$). That voltage, which appears at the gate terminal of the output load transistor N2, is not large enough to sufficiently turn on the output load transistor. In summary, when the CMOS radiation-measuring circuit is not exposed to radiation, the second side of the current mirror (transistor P3) is on, the output load transistor N2 is almost turned off, and the current that flows through the second side of the current mirror is much larger than $I_{sens}$. The value of the output voltage ($V_{out}$) is pulled to the supply voltage $V_{dd}$ through the transistor P3. In that mode of operation, the output voltage ($V_{out}$) represents a high digital state.

However, when the circuit is irradiated, the absolute value of the threshold voltage for the radiation-sensing transistor P1 increases, as described above. Once the threshold voltage increases above the value of the voltage ($V_a$), the radiation-sensing transistor P1 turns off. As can be seen from the approximation for $I_{sens}$ in the above equation, when P1 is turned off, the current ($I_{sens}$) through the first side of the current mirror (transistor P2) will drop to zero. As a result, the current that flows into the output load transistor N2 also decreases. At this point, the voltage ($V_a$) is only slightly less than the supply voltage $V_{dd}$ as a result of the voltage drop across the resistive element N1 and the transistor P2. This voltage ($V_a$), which also appears at the gate terminal of the output load transistor N2, causes the output load transistor N2 to turn on. The output voltage ($V_{out}$) of the CMOS radiation-measuring circuit is, thus, coupled to ground through the output load transistor N2. In that mode of operation, the output voltage ($V_{out}$) represents a digital low state. Therefore, the radiation-measuring circuit provides a digital output.

To allow the radiation-measuring circuit to sense different radiation doses, the threshold voltage of the radiation-sensing transistor P1 can be modified by changing the body bias of the transistor through the input voltage ($V_{in}$). The body bias is the voltage between the body terminal and the source terminal of the transistor $V_{bs}$. The voltage used to adjust the body bias may be applied, for example, from an external source that allows a user to adjust the value of $V_{in}$ when the CMOS radiation-measuring circuit is exposed to radiation. Alternatively, the voltage used to adjust the body bias may be an integrated voltage source based on bandgap or charge pump circuits that a user may adjust using software.

As discussed earlier, changing the threshold voltage of the radiation-sensing transistor P1 changes the dose required to turn off that transistor. Therefore, the dose required to change the output of the CMOS radiation-measuring circuit from one digital state to another can be altered by changing the body bias of the radiation-sensing transistor P1. A single radiation-measuring circuit can, therefore, be used to measure different dose values that the circuit may be exposed to.

The auxiliary circuit to which the radiation-sensing transistor P1 is coupled preferably is composed of components that, as a whole, are insensitive to threshold voltage shift due to radiation exposure. Preferably, pMOS transistors are used in the current mirror because this configuration tends to be less sensitive to threshold voltage shifts provided the threshold voltages of each pMOS transistor shift by the same amount. Resistive element N1 and the output load transistor N2 preferably are nMOS transistors because the absolute value of the threshold voltage shift in an nMOS transistor remains substantially unchanged. More specifically, the charge trapped in the oxide is positive for both nMOS and pMOS devices, whereas the interface state charge is positive for a pMOS and negative for an nMOS. Because these charge components have the same sign in a pMOS device, the threshold voltage of the pMOS device is shifted toward a more negative value. In contrast, because these charge components have opposite signs in an nMOS device, they induce a competing effect in threshold voltage shift and the resulting sign of the threshold voltage shift in an nMOS device depends on which charge component's contribution is dominant. Therefore, the absolute value of the threshold voltage shift is usually much higher in PMOS transistors than nMOS transistors.

An advantage of the foregoing techniques is the radiation dose that may be measured by the radiation-measuring circuit 1 need not be fixed. Therefore, CMOS radiation-measuring circuits need not incorporate several radiation-measuring circuits to measure different radiation doses. Also, the auxiliary circuit, used in the radiation-measuring circuit can be relatively impervious to radiation-induced changes.

Various modifications may be made. For example, the radiation-measuring circuit can include an nMOS current mirror, an nMOS radiation-sensing transistor, a pMOS resistive element coupled to the radiation-sensing transistor and a pMOS output load. Other implementations are within the scope of the following claims.

What is claimed is:

1. An apparatus comprising:

a radiation sensor with a threshold voltage;

an adjustable voltage source coupled to the radiation sensor to change a threshold level of the radiation sensor;

a current mirror; and an output load including a gate terminal and a drain terminal, wherein the radiation sensor has a source terminal coupled to a first side of the current mirror through a resistive element and coupled to the gate terminal of the output load and the drain terminal of the output load coupled to a second side of the current mirror.

2. The apparatus of claim 1 wherein the radiation sensor forms part of a radiation-measuring circuit and the adjustable voltage source is integrated into the radiation-measuring circuit.

3. The apparatus of claim 1 wherein a state of the radiation sensor controls a state of the output load.

4. The apparatus of claim 1 wherein the resistive element includes a transistor.

5. The apparatus of claim 1 wherein the resistive element includes a resistor.

6. The apparatus of claim 1 wherein the current mirror includes pMOS transistors and each of the radiation sensor, the resistive element and the output load includes an nMOS transistor.

7. The apparatus of claim 1 wherein the current mirror includes nMOS transistors and each of the radiation sensor, the resistive element, and the output load includes a pMOS transistor.

* * * * *